(12) United States Patent
Lee et al.

(10) Patent No.: US 8,154,919 B2
(45) Date of Patent: Apr. 10, 2012

(54) METHOD OF READING NONVOLATILE MEMORY DEVICE AND NONVOLATILE MEMORY DEVICE FOR IMPLEMENTING THE METHOD

(75) Inventors: Sang Kyu Lee, Chungcheongbuk-do (KR); Seung Jae Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 277 days.

(21) Appl. No.: 12/647,655

(22) Filed: Dec. 28, 2009

(65) Prior Publication Data
US 2010/0202196 A1    Aug. 12, 2010

(30) Foreign Application Priority Data
Feb. 6, 2009    (KR) .................... 10-2009-0009708

(51) Int. Cl.
*G11C 16/04*    (2006.01)

(52) U.S. Cl. .......... 365/185.02; 365/185.18; 365/189.07
(58) Field of Classification Search ............. 365/185.02, 365/185.03, 185.18, 189.07
See application file for complete search history.

(56) References Cited

U.S. PATENT DOCUMENTS 7,684,237 B2 *    3/2010    Moschiano et al. ..... 365/185.02
* cited by examiner

*Primary Examiner* — David Lam
(74) *Attorney, Agent, or Firm* — IP & T Group LLP

(57) ABSTRACT

A nonvolatile memory device includes a read margin critical value calculation unit configured to calculate a critical value of a read margin between a read voltage and a threshold voltage of a specific cell, an interference value calculation unit configured to calculate an interference value affecting the threshold voltage of the specific cell, a comparison unit configured to compare the critical value and the interference value and to output a result of the comparison, and a data selection unit configured to output either first data, read from the specific cell using a first read voltage, or second data, read from the specific cell using a second read voltage, based on the result outputted from the comparison unit.

12 Claims, 6 Drawing Sheets

METHOD OF READING NONVOLATILE MEMORY DEVICE AND NONVOLATILE MEMORY DEVICE FOR IMPLEMENTING THE METHOD

CROSS-REFERENCE TO RELATED APPLICATION

Priority to Korean patent application number 10-2009-0009708 filed on Feb. 6, 2009, the entire disclosure of which is incorporated by reference herein, is claimed.

BACKGROUND

One or more embodiments relate to a nonvolatile memory device and, more particularly, to a method of reducing errors resulting from interference when a read operation is performed in a nonvolatile memory device.

In recent years, there is an increasing demand for nonvolatile memory devices, which can be electrically programmed and erased and which do not require the refresh function of rewriting data at specific intervals.

The nonvolatile memory cell of the nonvolatile memory device can be electrically programmed and erased, and the program and erase operations are performed using the threshold voltage of the cell, which varies when electrons are moved by a strong electric field applied to the thin oxide layer of the cell.

In such a method of programming a nonvolatile memory device, interference phenomena may be generated as a result of a shift in the threshold voltages of neighboring cells. In particular, in a method of programming a multi-level cell (MLC) capable of storing data of 2 bits or more in one cell, malfunction resulting from such interference phenomena may happen because a margin between the threshold voltages in each state is narrowed. Accordingly, interference resulting from the program operations of neighboring memory cells needs to be minimized. The MLC program method is performed to store information of 2 bits or more in one cell. In an SLC program method, two different states with different threshold voltages are generated by a program operation. In the MLC program method, information of 2 bits or more is stored by repeatedly performing the program operation.

FIG. 1 is a diagram illustrating an interference phenomenon of a nonvolatile memory device. In FIG. 1, dotted lines show distributions of the threshold voltages when an interference phenomenon is not generated, and solid lines show distributions of the threshold voltages when interference phenomena are generated. Portions of the distributions indicated by a letter 'A' show portions in which interference is generated and the threshold voltages overlap each other.

As described above, since data are stored in one cell, the number of threshold voltages Vt distinguishing between the data is increased, and so a gap between the threshold voltages is narrowed. Accordingly, as shown in FIG. 1, an interference phenomenon in which the threshold voltages overlap each other can occur, which leads to an inaccurate data reading when a read operation is performed.

BRIEF SUMMARY

One or more embodiments relate to a method and a nonvolatile memory device, which are capable of reducing errors in the read operation resulting from interference in the case in which data are stored in one cell, such as in an MLC.

A nonvolatile memory device according to an aspect of this disclosure includes a read margin critical value calculation unit configured to calculate a critical value of a read margin between a read voltage and a threshold voltage of a specific cell, an interference value calculation unit configured to calculate an interference value affecting the threshold voltage of the specific cell, a comparison unit configured to compare the critical value and the interference value and to output a result of the comparison, and a data selection unit configured to output either first data, read from the specific cell using a first read voltage, or second data, read from the specific cell using a second read voltage, based on the result outputted from the comparison unit.

The first read voltage is a typical read voltage, and the second read voltage is obtained by adjusting the first read voltage with the interference value.

The second read voltage is obtained by adding a maximum value of the interference value to the first read voltage.

The data selection unit is configured to output the first data when a result of the comparison indicates that the interference value is less than the critical value, and to output the second data when a result of the comparison indicates that the interference value is greater than or equal to the critical value.

The interference value calculation unit includes a coefficient memory configured to store an interference coefficient corresponding to interference occurring when program operations are performed on memory cells neighboring the specific cell, a threshold voltage shift amount memory configured to store a shift amount of the threshold voltage of the specific cell when the program operations are performed on the neighboring memory cells, a calculation unit configured to calculate a digital interference value using the interference coefficient and the shift amount, and a digital/analog converter (DAC) configured to convert the digital interference value into an analog value, which is the interference value.

The interference value calculation unit further comprises a temperature compensation processor configured to compensate for the analog value with a compensation ratio according to a detected temperature.

The interference value calculation unit further comprises a temperature sensor for detecting a temperature.

A read method in a nonvolatile memory device according to another aspect of this disclosure includes calculating an interference value affecting a threshold voltage of a specific cell, calculating a critical value of a read margin between a read voltage and the threshold voltage of the specific cell, reading data stored in the specific cell using a first read voltage, reading data stored in the specific cell using a second read voltage obtained by adjusting the first read voltage with the interference value, and comparing the interference value and the critical value, and outputting first data, if the interference value is less than the critical value, or outputting second data, if the interference value is greater than or equal to the critical value.

The second read voltage is obtained by adding a maximum value of the interference value to the first read voltage.

Calculating the interference value includes storing an interference coefficient corresponding to interference occurring when program operations are performed on memory cells neighboring the specific cell, and storing a shift amount of the threshold voltage of the specific cell when the program operations are performed on the neighboring memory cells.

Calculating the interference value also includes calculating a digital interference value using the interference coefficient and the shift amount, and converting the digital interference value into an analog value, which is the interference value.

The read method further includes adjusting the interference value with a compensation ratio according to a detected temperature.

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1:
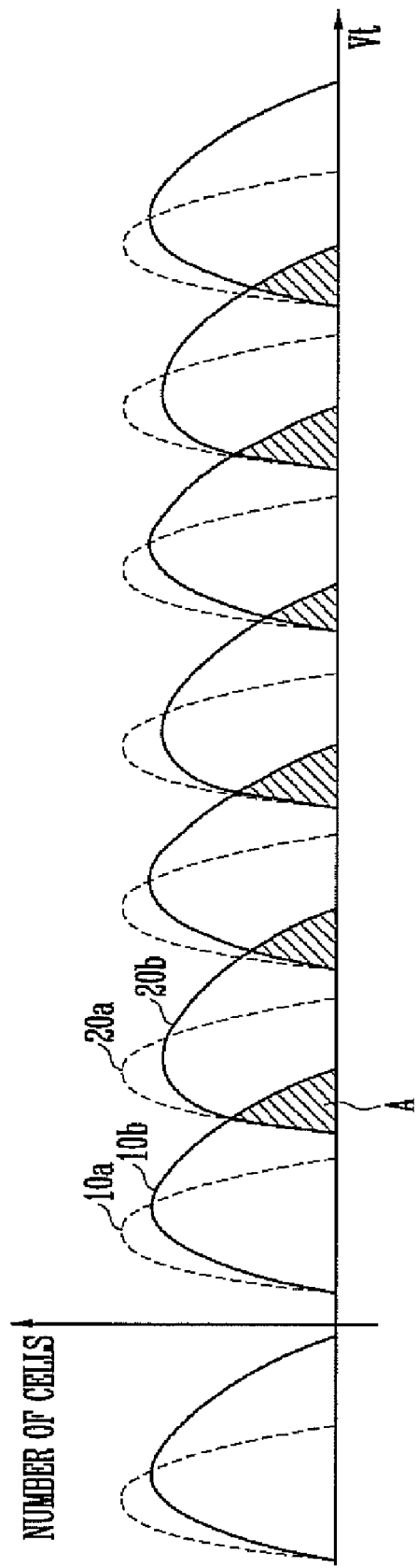
FIG. 1 is a diagram illustrating an interference phenomenon of a nonvolatile memory device.
Figure 2:
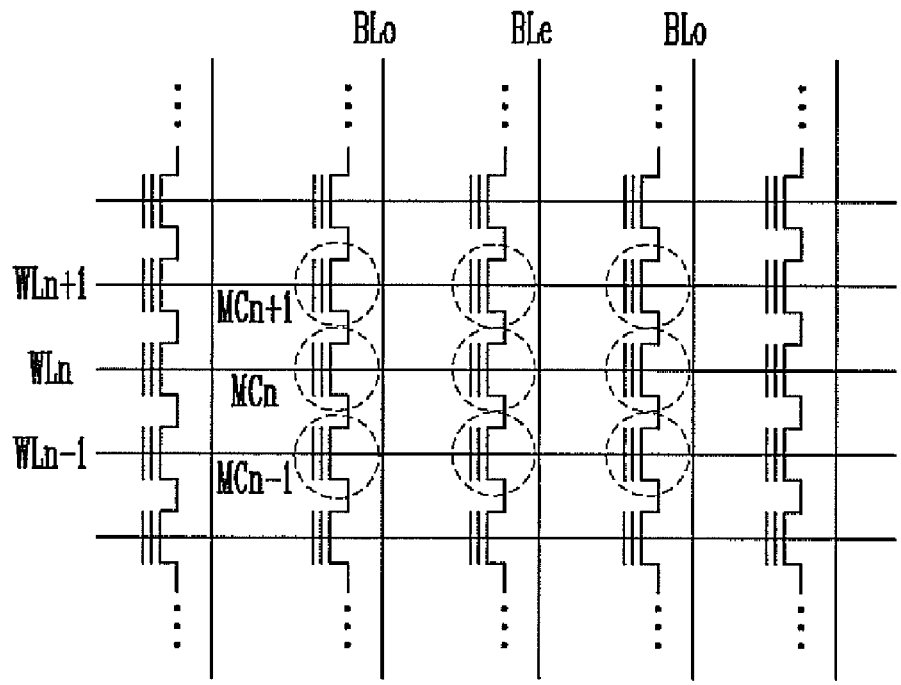
FIG. 2 is a diagram showing the memory cell array of a nonvolatile memory device.

FIG. 2 is a diagram showing the memory cell array of a nonvolatile memory device.

Referring to FIG. 2, the memory cell array includes memory cells $MC_{n-1}$, $MC_n$, and $MC_{n+1}$ configured to store data, word lines $WL_{n-1}$, $WL_n$, and $WL_{n+1}$ configured to select the memory cells, and bit lines BLo, BLe configured to input and output data to and from the memory cells. The plurality of word lines and the plurality of bit lines are arranged in a matrix form. The even bit line BLe and the odd bit line BLo are alternately coupled to a memory cell string.

Figure 3:
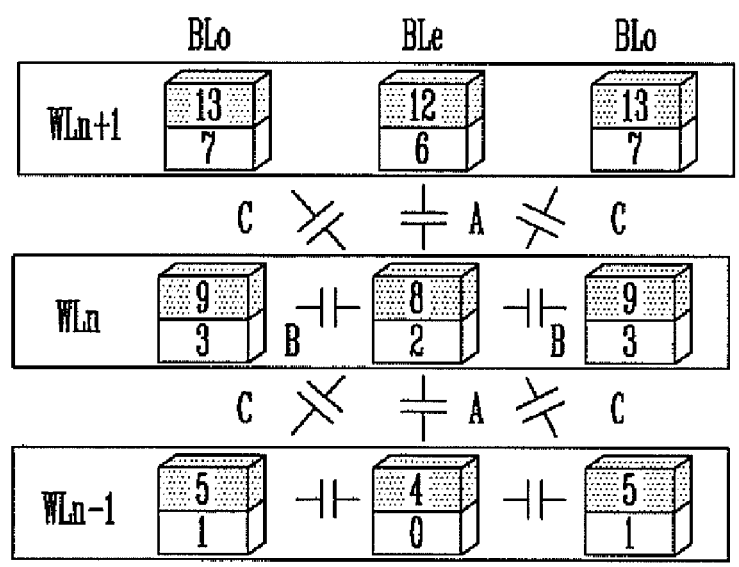
FIG. 3 is a diagram showing the sequence of program operations performed in the nonvolatile memory device.

FIG. 3 is a diagram showing the sequence of program operations performed in the nonvolatile memory device. The numbers in each cuboid represent the order in which the program operations are performed.

Referring to FIG. 3, a least significant bit (LSB) program operation is first started at the even bit line BLe of the word line $WL_{n-1}$. Then an LSB program operation is performed at the odd bit lines BLo of the word line $WL_{n-1}$. Next, a third LSB program operation is performed at the even bit line BLe of the word line $WL_n$, and a fourth LSB operation is performed at the odd bit lines BLo of the word line $WL_n$. Next, MSB program operations are performed at the even bit line BLe and the odd bit lines BLo of the word line $WL_{n-1}$, in that order. A sixth operation is a LSB operation which is performed at the even bit line BLe of the word line $WL_{n+1}$. Then, LSB operations are performed at the odd bit lines BLo of the word line $WL_{n+1}$. Still further, an eighth operation is an MSB operation at the even bit line BLe of the word line $WL_{n+1}$, and ninth operations are MSB operations at the odd bit lines BLo of the word line $WL_n$. In this manner, the LSB and MSB program operations are sequentially performed in the sequence indicated in FIG. 3.

Here, the cell indicated by Nos. 2 and 8 is subject to interference resulting from program operations performed on neighboring cells after second and eighth program operations were performed on the cell. In FIG. 3, a letter 'A' indicates the coupling ratio resulting from the program operations performed on the neighboring cells in the Y direction, 'B' indicates the coupling ratio resulting from the program operations performed on the neighboring cells in the X direction, and 'C' indicates the coupling ratio resulting from the program operations performed on the neighboring cells in the diagonal directions.

Figure 4:
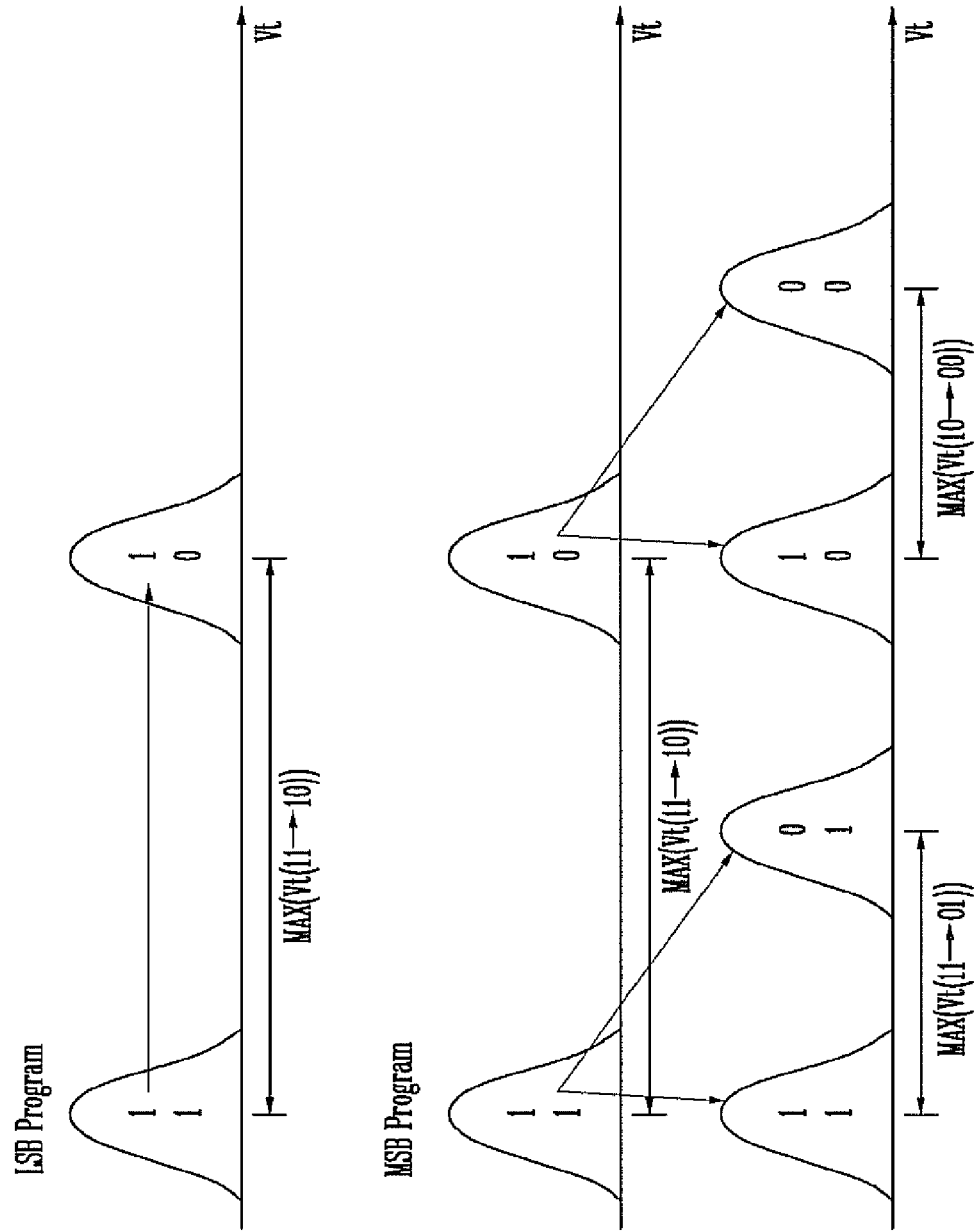
FIG. 4 is a diagram illustrating an MLC program method in the nonvolatile memory device.

FIG. 4 is a diagram illustrating an MLC program method in the nonvolatile memory device.

As shown in FIG. 4, the threshold voltages of memory cells are shifted from a state '11' to a state '10' by means of an LSB program operation. Next, the threshold voltages of some of the memory cells (i.e., the state '11') are shifted to a state '01' and the threshold voltages of some of the memory cells (i.e., the state '10') are shifted to a state '00' by means of an MSB program operation.

Interference generated when an MLC program is performed has so far been described. A method of reducing reading errors resulting from interference phenomena is described below.

Figure 5:
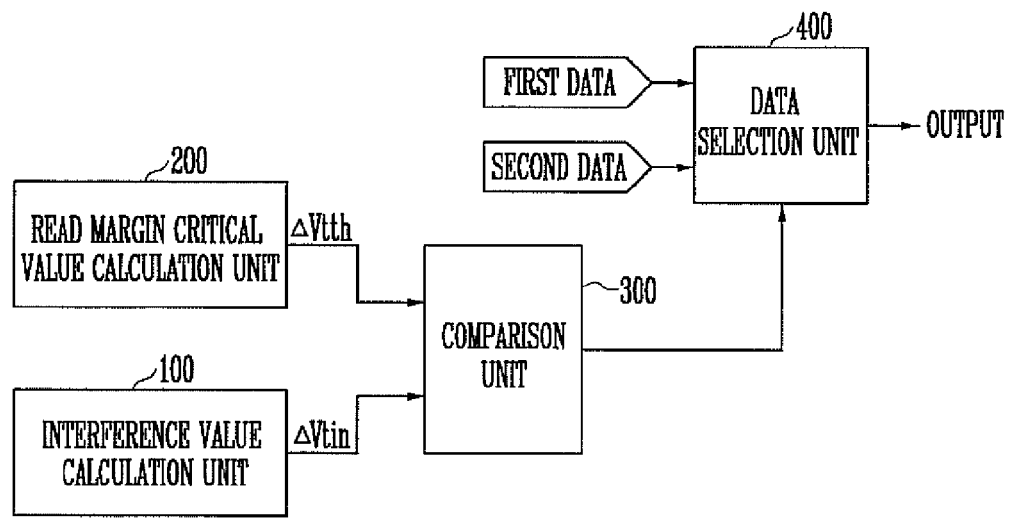
FIG. 5 is a block diagram of a nonvolatile memory device according to an embodiment of this disclosure.

FIG. 5 is a block diagram of a nonvolatile memory device according to an embodiment of this disclosure. The nonvolatile memory device includes an interference value calculation unit 100, a read margin critical value calculation unit 200, a comparison unit 300, and a data selection unit 400.

The interference value calculation unit 100 is configured to calculate an interference value $\Delta Vtin$ affecting the threshold voltage of a specific cell.

The read margin critical value calculation unit 200 is configured to calculate a read margin critical value $\Delta Vtth$ between a read voltage and the threshold voltage of a specific cell. The read margin critical value $\Delta Vtth$ is shown in FIG. 8.

The comparison unit 300 is configured to compare the critical value $\Delta Vtth$ and the interference value Vtin and to output a result of the comparison.

The data selection unit 400 is configured to output either first data, read from a specific cell using a first read voltage, or second data, read from the specific cell using a second read voltage, based on the result outputted from the comparison unit 300. Here, the first read voltage is a typical read voltage, and the second read voltage preferably is obtained by compensating for the first read voltage with the interference value $\Delta Vtin$. For example, the second read voltage can be obtained by adding a maximum value of the interference value $\Delta Vtin$ to the first read voltage.

Figure 8:
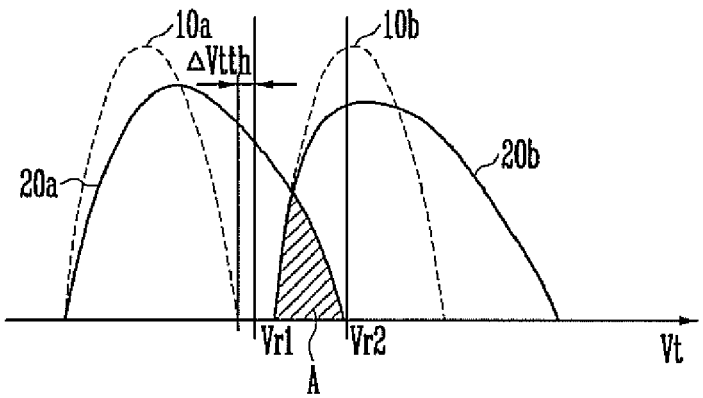
FIG. 8 is a diagram illustrating read voltage and read margins in the nonvolatile memory device according to an embodiment of this disclosure.

FIG. 8 illustrates an ideal threshold voltage distribution 10a of a first state, an ideal threshold voltage distribution 10b of a second state, a real threshold voltage distribution 20a of the first state, and a real threshold voltage distribution 20b of the second state. There is shown a portion 'A' in which the real threshold voltage distribution 20a of the first state and the real threshold voltage distribution 20b of the second state overlap each other because of interference. Here, a first read voltage Vr1 is a typical read voltage, and a second read voltage Vr2 is obtained by adding a maximum value of the interference value $\Delta Vtin$ to the first read voltage Vr1. As described above, in the present disclosure, data are twice read from one cell; once using the first read voltage Vr1 and the other using the second read voltage Vr2.

In the present disclosure, when the comparison unit 300 outputs a result indicating that the interference value $\Delta Vtin$ is less than the critical value $\Delta Vtth$, the data selection unit 400 outputs the first data. When the comparison unit 300 outputs a result indicating that the interference value ΔVtin is the critical value ΔVtth or more, the data selection unit 400 outputs the second data.

Figure 6:
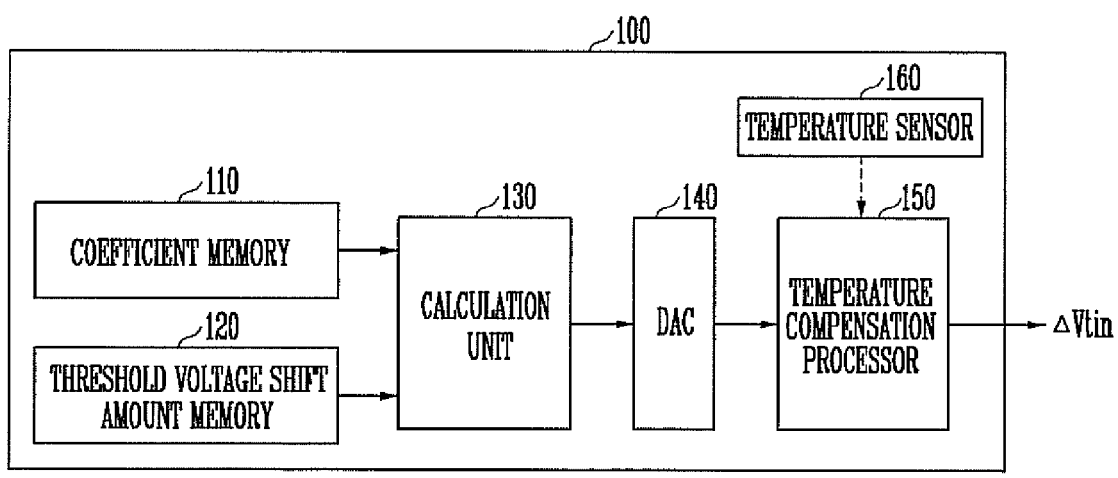
FIG. 6 is a block diagram showing the internal construction of an interference value calculation unit in the nonvolatile memory device according to an embodiment of this disclosure.

FIG. 6 is a block diagram showing the internal construction of the interference value calculation unit 100 according to an embodiment of this disclosure. The interference value calculation unit 100 includes a coefficient memory 110, a threshold voltage shift amount memory 120, a calculation unit 130, a digital/analog converter (DAC) 140, and a temperature compensation processor 150.

The coefficient memory 110 is configured to store an interference coefficient occurring when programs are performed on neighboring memory cells. For example, in FIG. 3, the cell indicated by Nos. 2 and 8 can be subject to the interference of the A, B, and C components resulting from program operations performed on neighboring memory cells. An interference coefficient obtained by calculating the interference of the A, B, and C components is stored in the coefficient memory 110.

The threshold voltage shift amount memory 120 is configured to store the shift amount of a threshold voltage when a program is performed. For example, in FIG. 4, the threshold voltage shift amount memory 120 can store a shift amount from the state '11' to the state '10' when the LSB program is performed, a shift amount from the state '11' to the state '01' when the MSB program operation is performed, a shift amount from the state '10' to the state '00' when the MSB program operation is performed, and so on.

The calculation unit 130 is configured to calculate a digital interference value using an interference coefficient and a shift amount.

An example in which the interference value is calculated using an equation according to this disclosure is described below. For example, it is assumed that, in FIG. 3, the cell labeled with Nos. 2 and 8 is subject to the interference of the A components occurring when cells labeled with Nos. 4 and 6 are programmed, to the interference of the B components occurring when cells labeled with No. 3 are programmed, and to the interference of the C components occurring when cells labeled with Nos. 5 and 7 are programmed. In this case, the interference value for the cell labeled with No. 2 can be expressed using the following equation:

$$\text{Interference value}(2) = A*Vt(1110) + A*\text{MAX}(Vt(1101), Vt(1000)) + 2*B*Vt(1110) + 2C*Vt(1110) + 2C*\text{MAX}(Vt(1101), VT(1000)) \quad \text{(Equation 1)}$$

Where 'A' indicates the interference coefficient of the A components, 'B' indicates the interference coefficient of the B components, and 'C' indicates the interference coefficient of the C components. Vt(1110) indicates a threshold voltage shift amount when the threshold voltage of the cell labeled with No. 2 shifts from the state '11' to the state '10', Vt(1101) indicates a threshold voltage shift amount when the threshold voltage shifts from the state '11' to the state '01', and Vt(1000) indicates a threshold voltage shift amount when the threshold voltage shifts from the state '10' to the state '00'. MAX(x,y) indicates a maximum value.

As another example, the cell labeled with Nos. 2 and 8 shown in FIG. 3 is subject to the interference of the A component occurring when a cell labeled with No. 12 is programmed, to the interference of the B components occurring when cells labeled with No. 9 are programmed, and to the interference of the C components occurring when cells labeled with No. 13 are programmed. Here, an interference value for the cell No. 8 can be expressed using the following equation:

$$\text{Interference value}(8) = A*\text{MAX}(Vt(1101), Vt(1000)) + 2*B*\text{MAX}(Vt(1101), Vt(1000)) + 2C*\text{MAX}(Vt(1101), Vt(1000)) \quad \text{(Equation 2)}$$

Where 'A' indicates an interference coefficient of the A components, 'B' indicates an interference coefficient of the B components, and 'C' indicates an interference coefficient of the C components. Vt(1101) indicates a threshold voltage shift amount when the threshold voltage of the cell labeled with No. 8 shifts from the state '11' to the state '01', Vt(1000) indicates a threshold voltage shift amount when the threshold voltage shifts from the state '10' to the state '00', and MAX(x,y) indicates a maximum value.

The DAC 140 is configured to convert the digital interference value into an analog value.

The temperature compensation processor 150 is configured to compensate for the analog value, received from the DAC 140, with a compensation ratio according to a detected temperature.

A temperature sensor 160 is configured to detect a temperature. In this disclosure, the temperature sensor 160 may be incorporated into the interference value calculation unit 100 or may be implemented into an external component.

Figure 7:
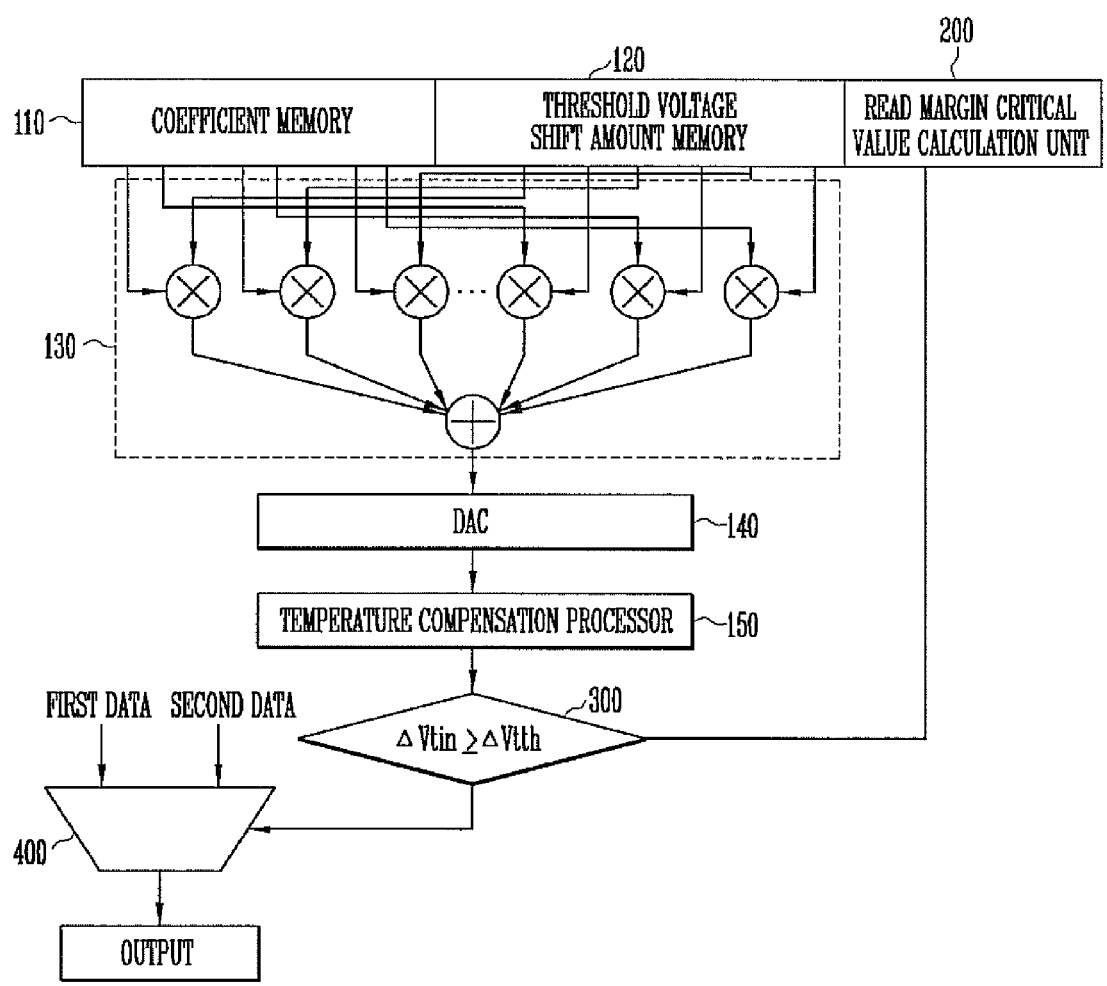
FIG. 7 is a conceptual diagram showing the nonvolatile memory device according to the embodiment of this disclosure.

FIG. 7 is a conceptual diagram showing the nonvolatile memory device according to an embodiment of this disclosure.

The calculation unit 130 calculates a digital interference value using an interference coefficient, stored in the coefficient memory 110, and a threshold voltage shift amount stored in the threshold voltage shift amount memory 120. The interference value is converted into an analog value by the DAC 140. The converted analog value is compensated for with a compensation value according to a temperature by the temperature compensation processor 150, and then outputted.

The comparison unit 300 compares a critical value ΔVtth and the interference value ΔVtin and outputs a result of the comparison.

First data received using a first read voltage and second data read using a second read voltage are inputted to the data selection unit 400. The data selection unit 400 outputs either the first data or the second data based on the result outputted from the comparison unit 300.

Figure 9:
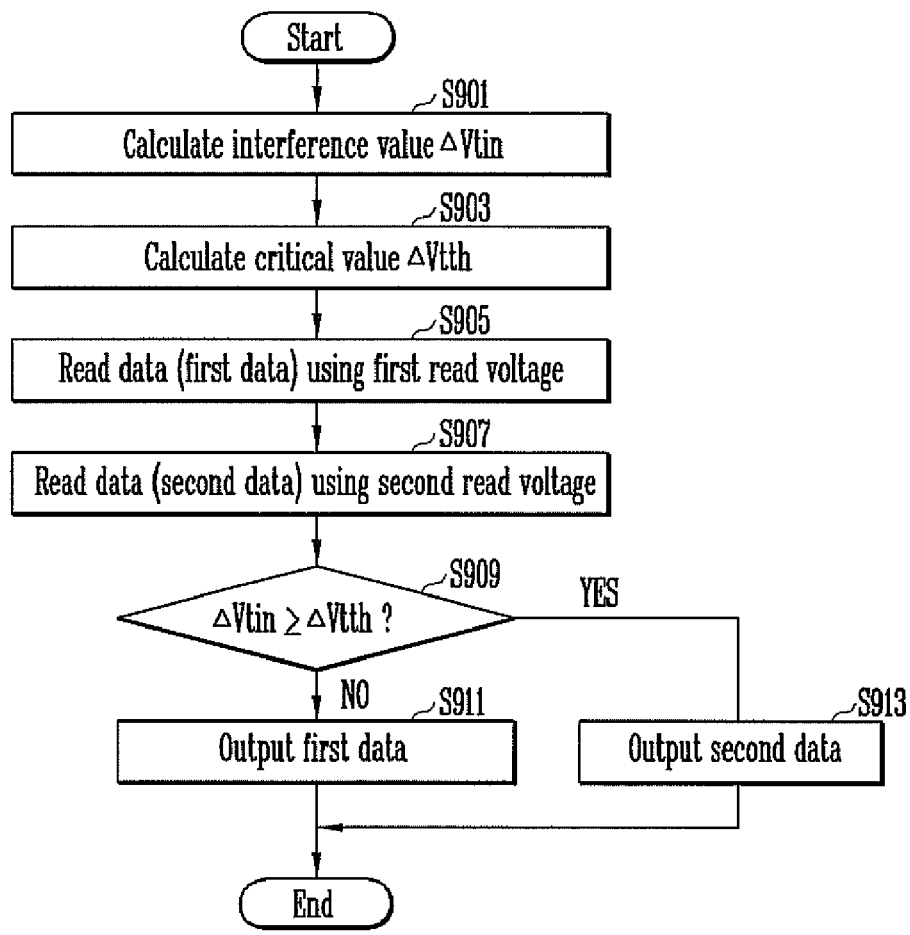
FIG. 9 is a flowchart illustrating a read method in the nonvolatile memory device according to an embodiment of this disclosure.

FIG. 9 is a flowchart illustrating a read method in the nonvolatile memory device according to an embodiment of this disclosure.

First, an interference value ΔVtin affecting the threshold voltages of a specific cell is calculated at step S901. In the embodiment of this disclosure, the step S901 includes storing an interference coefficient occurring when programs are performed on neighboring cells, storing a shift amount of the threshold voltage of the specific cell when the programs are performed on the neighboring cells, and calculating an interference value ΔVtin using the interference coefficient and the shift amount.

Here, the step S901 can include calculating a digital interference value using the interference coefficient and the shift amount and converting the digital interference value into an analog value. Furthermore, in the embodiment of this disclosure, the interference value ΔVtin can be compensated for with a compensation ratio according to a detected temperature, and then outputted.

A critical value ΔVtth of a read margin between a read voltage and the threshold voltage of the specific cell is calculated at step S903.

Data stored in the specific cell are read using a first read voltage at step S905. In this disclosure, the data read using the first read voltage is called first data.

Data stored in the specific cell are read using a second read voltage, which is obtained by compensating for the first read voltage with the interference value ΔVtin, at step S907. In the present disclosure, the data read using the second read voltage is called second data. In the embodiment of this disclosure, the second read voltage can be obtained by adding a maximum value of the interference value ΔVtin to the first read voltage.

It is then determined whether the interference value ΔVtin is the critical value ΔVtth or more at step S909.

If, as a result of the determination, the interference value ΔVtin is determined to be less than the critical value ΔVtth, the first data is outputted at step S911.

However, if, as a result of the determination, the interference value ΔVtin is determined to be the critical value ΔVtth or more, the second data is outputted at step S913.

As described above, according to the nonvolatile memory device of the present disclosure, read errors resulting from interference can be reduced. Accordingly, the characteristics and yield of the devices can be improved.

What is claimed is:

1. A nonvolatile memory device, comprising:
   a read margin critical value calculation unit configured to calculate a critical value of a read margin between a read voltage and a threshold voltage of a specific cell;
   an interference value calculation unit configured to calculate an interference value affecting the threshold voltage of the specific cell;
   a comparison unit configured to compare the critical value and the interference value and to output a result of the comparison; and
   a data selection unit configured to output either first data, read from the specific cell using a first read voltage, or second data, read from the specific cell using a second read voltage, based on the result outputted from the comparison unit.

2. The nonvolatile memory device of claim 1, wherein:
   the first read voltage is a typical read voltage, and
   the second read voltage is obtained by adjusting the first read voltage with the interference value.

3. The nonvolatile memory device of claim 2, wherein the second read voltage is obtained by adding a maximum value of the interference value to the first read voltage.

4. The nonvolatile memory device of claim 2, wherein the data selection unit is configured to output the first data when a result of the comparison indicates that the interference value is less than the critical value, and to output the second data when a result of the comparison indicates that the interference value is greater than or equal to the critical value.

5. The nonvolatile memory device of claim 1, wherein the interference value calculation unit comprises:
   a coefficient memory configured to store an interference coefficient corresponding to interference occurring when program operations are performed on memory cells neighboring the specific cell;
   a threshold voltage shift amount memory configured to store a shift amount of the threshold voltage of the specific cell when the program operations are performed on the neighboring memory cells;
   a calculation unit configured to calculate a digital interference value using the interference coefficient and the shift amount; and
   a digital/analog converter (DAC) configured to convert the digital interference value into an analog value, which is the interference value.

6. The nonvolatile memory device of claim 5, wherein the interference value calculation unit further comprises a temperature compensation processor configured to compensate for the analog value with a compensation ratio according to a detected temperature.

7. The nonvolatile memory device of claim 6, wherein the interference value calculation unit further comprises a temperature sensor for detecting a temperature.

8. A read method in a nonvolatile memory device, comprising:
   calculating an interference value affecting a threshold voltage of a specific cell;
   calculating a critical value of a read margin between a read voltage and the threshold voltage of the specific cell;
   reading data stored in the specific cell using a first read voltage;
   reading data stored in the specific cell using a second read voltage obtained by adjusting the first read voltage with the interference value; and
   comparing the interference value and the critical value, and outputting first data, if the interference value is less than the critical value, or outputting second data, if the interference value is greater than or equal to the critical value.

9. The read method of claim 8, wherein the second read voltage is obtained by adding a maximum value of the interference value to the first read voltage.

10. The read method of claim 8, wherein calculating the interference value comprises:
    storing an interference coefficient corresponding to interference occurring when program operations are performed on memory cells neighboring the specific cell; and
    storing a shift amount of the threshold voltage of the specific cell when the program operations are performed on the neighboring memory cells.

11. The read method of claim 10, wherein calculating the interference value further comprises:
    calculating a digital interference value using the interference coefficient and the shift amount; and
    converting the digital interference value into an analog value, which is the interference value.

12. The read method of claim 10, further comprising adjusting the interference value with a compensation ratio according to a detected temperature.

* * * * *